United States Patent
Shue et al.

[19]

[11] Patent Number: 6,140,241
[45] Date of Patent: Oct. 31, 2000

[54] MULTI-STEP ELECTROCHEMICAL COPPER DEPOSITION PROCESS WITH IMPROVED FILLING CAPABILITY

[75] Inventors: Shau-Lin Shue, Hsinchu; Ming-Hsing Tsai, Taipei; Wen-Jye Tsai, Tainan; Chen-Hua Yu, Hsin-Chu, all of Taiwan

[73] Assignee: Taiwan Semiconductor Manufacturing Company, Hsin-Chu, Taiwan

[21] Appl. No.: 09/270,591

[22] Filed: Mar. 18, 1999

[51] Int. Cl.[7] .......................... H01L 21/302; H01L 21/461
[52] U.S. Cl. ............................ 438/692; 438/687; 205/222
[58] Field of Search .................... 438/633, 692, 438/693, 754, 756, 757, 697, 700, 706, 687; 134/2–3; 216/18, 38, 88; 205/222

[56] References Cited

U.S. PATENT DOCUMENTS

| | | | |
|---|---|---|---|
| 5,151,168 | 9/1992 | Gilton et al. | 205/123 |
| 5,662,788 | 9/1997 | Sandhu et al. | 205/87 |
| 5,723,387 | 3/1998 | Chen | 438/692 |
| 6,056,864 | 5/2000 | Cheung | 205/202 |

OTHER PUBLICATIONS

Badih El–Kareh, "Fundamentals of Semiconductor Processing Technologies", Kluwer Academic Publishers, Boston (1995) p. 563–4.

Chang et al., "ULSI Technology", The McGraw–Hill Companies, Inc., NY, (1996), pp. 444–445.

*Primary Examiner*—Matthew Smith
*Assistant Examiner*—Calvin Lee
*Attorney, Agent, or Firm*—George O. Saile; Stephen B. Ackerman

[57] ABSTRACT

A multi-step electrochemical method for forming a copper metallurgy on an integrated circuit which has high aspect ratio contact/via openings is described. The method is designed to give good coverage and gap filling capability as well as high production throughput by performing the electrochemical deposition of copper in two deposition stages with an dwell period between the stages. The process utilizes a copper plating electrolyte which contains an added brightener and leveler. The first deposition is done at a low current density which provides good coverage resulting from a high throwing power. The high aspect ratio contact/via openings are covered with a substantial thickness of a uniform, high quality copper coating. During the deposition, the concentration of brightener becomes depleted in the base region of high aspect ratio contacts or vias. The concentration of brighteners, is replenished in these regions by diffusion during a brief dwell period wherein the plating current is stopped. Next, a high current density is applied whereby the contact/vias are filled and additional copper is deposited over them at a high deposition rate. The greatest throughput benefits are realized, by way of the high current density step, when the process is applied to the formation of a dual damascene metallurgy.

24 Claims, 8 Drawing Sheets

MULTI-STEP ELECTROCHEMICAL COPPER DEPOSITION PROCESS WITH IMPROVED FILLING CAPABILITY

BACKGROUND OF THE INVENTION (1) Field of the Invention

The invention relates to processes for the manufacture of semiconductor devices and more particularly to the formation of high aspect ratio metal and vias by electrochemical deposition.

(2) Background of the Invention and Description of Prior Art

Integrated circuits are manufactured by forming discrete semiconductor devices in the surface of silicon wafers. A multi-level metallurgical interconnection network is then formed over the devices, contacting their active elements, and wiring them together to create the desired circuits. The wiring layers are formed by depositing an insulating layer over the discrete devices, patterning and etching contact openings into this layer, and then depositing conductive material into the openings. A conductive layer is applied over the insulating layer and patterned to form wiring interconnections between the device contacts, thereby creating a first level of basic circuitry. The circuits are then further interconnected by utilizing additional wiring levels laid out over additional insulating layers with conductive via pass throughs. Depending upon the complexity of the overall integrated circuit, several levels of wiring interconnections are used.

A method for forming the interconnection layer is the damascene process, whereby openings and trenches, comprising an image of the interconnection pattern are formed in an insulative layer. A metal layer is then deposited into the openings and over the insulative layer. Finally, the metal is polished back to the insulative layer leaving the metal pattern inlaid within the insulative layer. Polishing back of the metal layer is accomplished by CMP (chemical mechanical polishing), a relatively old process which has found new application in planarization of insulative layers and more recently in the damascene process. In a single damascene process a metal line pattern is generated which connects to subjacent vias or contacts. In a dual damascene process, both vias and contacts and an interconnection stripe pattern are formed by a single metal deposition and CMP. A description of both single and dual damascene processes may be found in Chang, C. Y. and Sze, S. M., "ULSI Technology" McGraw-Hill, New York, (1996), p444–445 and in El-Kareh, B., "Fundamentals of Semiconductor Processing Technologies", Kluwer, Boston(1995), p563–4.

Deposition of the metal layer can be by PVD (physical vapor deposition) methods such as sputtering or vacuum evaporation, by CVD (chemical vapor deposition), or by ECD (electrochemical deposition). The ECD method involves placing the wafer into an electrolyte bath and electro plating a metal layer onto the wafer surface by applying of an electric field between the wafer and the electrolyte. The ECD method has been found to be particularly desirable for the deposition of copper.

Chen, U.S. Pat. No. 5,723,387 shows a method and apparatus for the preparation of a copper interconnection metallurgy using eletroplating or electroless plating techniques. The copper is deposited onto a TiW barrier layer which itself is deposited by electroless plating. The disclosed apparatus includes a CMP station for polishing the copper plate after deposition. Sandhu, et.al., U.S. Pat. No. 5,662,788 shows a process for selective electrochemical deposition of a metal layer using an alternating voltage superimposed on a dc potential and a patterned layer having a higher surface potential than a subjacent non-patterned layer. Although the metal deposits on both the patterned layer and the exposed subjacent layer during the first half of the voltage cycle, it is selectively removed from the subjacent layer during the second half of the cycle, leaving the metal deposited only on the patterned layer. Gilton, et.al., U.S. Pat. No. 5,151,168 shows an ECD process wherein current densities of less than 1 milliampere/$cm^2$ are used to deposit copper onto a barrier layer to fill contact and via openings. Such low current densities, although producing good quality copper deposits would also be expected to have a very low throughput.

In the electroplating process, brighteners and levelers are added to the electrolyte to improve the quality and conformality of the deposited metal layer. Levelers are additives which adsorb onto high field regions of the substrate in the plating bath. Such regions occur at protrusions and sharp outside corners. The levelers adsorb on these regions and thereby inhibit the growth rate of the plated film in these regions, producing a rounding or smoothing over of the corners or protrusions. Brighteners are additives which adsorb onto regions of low electric field and participate in the charge transfer mechanism of the electrochemical deposition process. Brighteners, affect crystalline quality by refining grain size which is critical to control sheet resistance and electromigration tolerance.

Brighteners are consumed by the electrochemical process and must therefore be replenished at the growth front during the ECD. In conventional plating processes, brighteners are replenished at the reaction front from the bulk of the electrolyte, by normal diffusion assisted by mechanical agitation of the plating bath. However, in the presence of high aspect ratio contact/via openings and trenches typically found in current high density integrated circuits, conventional agitation of the electrolyte becomes inadequate for timely replenishment of the depleted brighteners at the bases of the openings and trenches. Replenishment of additives must then rely on diffusion alone, requiring the reduction of deposition current density and thereby the process throughput. The film quality and throughput of the currently used single step ECD processes are therefore limited by the mass transfer of additives to the deposition front. An Inadequate supply of these additives at the deposition front result in poor gap filling as well as reduced mechanical and electrical quality of the electrodeposited metal layer.

It is therefore desirable to have a process which would provide good gap filling of high aspect ratio openings and also provide a high throughput for metal layers deposited onto damascene type structures.

SUMMARY OF THE INVENTION

Accordingly, it is an object of this invention to provide a method for improving the metal quality and filling by electrochemical deposition, of damascene structures having high aspect ratio openings and trenches.

It is another object of this invention to provide an improved method of increasing the throughput of an electrochemical deposition process for forming metal layers on damascene structures.

These objects are accomplished by performing the an initial step of the electrochemical deposition at a low current density whereby the deposition is highly conformal and the deposition rate is sufficiently low so that brightener depletion at the base of high aspect ratio features is kept at a minimum. During this initial deposition stage, a large portion of the high aspect ratio features are filled along the sidewalls and the bottom filling is high. Following the low current density step, the deposition process is stopped by removing the applied potential and a dwell period is entered wherein brightener additive molecules are permitted to diffuse into the lower regions of the high aspect ratio openings and/or trenches, replenishing these regions. A final deposition period is then begun at a high current density wherein the high aspect ratio openings and/or trenches are filled and the remainder of the top surface metal is deposited.

When dual damascene structures are to be filled, the top surface metallization includes both the wide regions of the interconnection wiring pattern and additional sacrificial metal which is subsequently polished back during the planarization. The deposition rate is high during this final period and therefore the throughput of the process is improved. Clearly the increased throughput attainable by the final high current density step is best realized when applied to a dual damascene process.

DESCRIPTION OF THE PREFERRED EMBODIMENTS

Figure 1A:
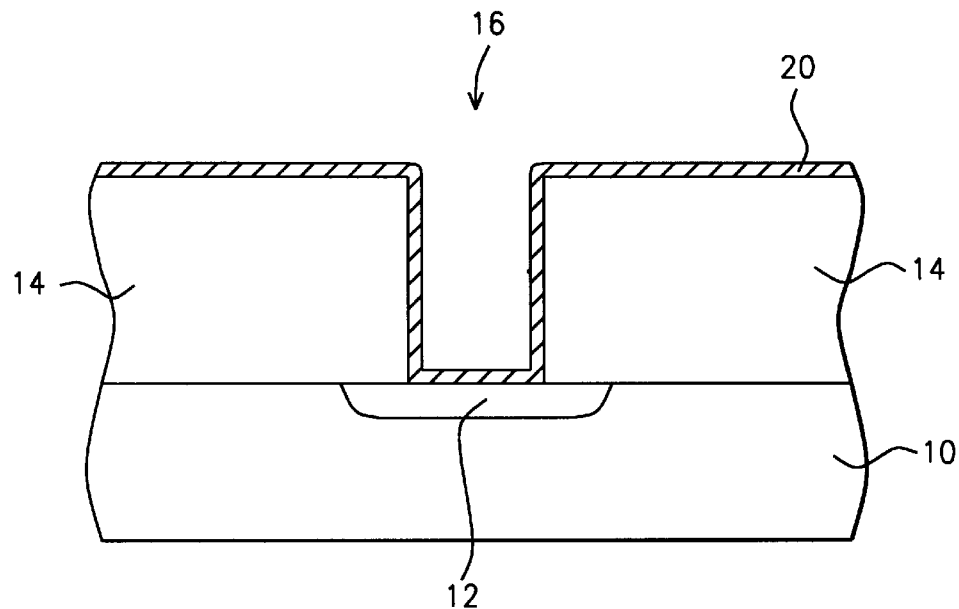
FIG. 1A through FIG. 1F are cross sections of a silicon wafer showing a sequence of process steps for forming a contact according to the process of a first embodiment of this invention.

In a first embodiment of this invention a copper plug is formed in a contact opening of an integrated circuit. Referring to FIG. 1A a 200 mm diameter silicon wafer 10 is provided. The region 12 is an element of a semiconductive device to which a contact is to be formed. The region 12 is formed in the surface of the wafer 10 by procedures well known in the art of semiconductor manufacturing. An insulative layer 14 is formed on the wafer 10 by a conventional deposition method such as PECVD (plasma enhanced chemical vapor deposition) or HDP (high density plasma) deposition. A preferred insulative layer for the current application is BPSG (borophosphosilicate glass). Alternatively, other insulative materials such as silicon oxide or a combination of insulative materials may be used. An opening 16 is patterned in the insulative layer 14 using a photoresist mask and an anisotropic dry etching technique, for example RIE (reactive ion etching) or plasma etching. Such patterning procedures are well known in the art. The width of the opening 16 is in the sub-half micron range.

A thin conductive barrier/seed layer 20 is deposited on the wafer, preferably by ionized PVD, for example, by IMP (ion metal plasma) sputtering. The barrier/seed layer 20 is a laminar structure comprising a base layer of a barrier material such as TiN, TaN, Ta or $WN_x$, over which a thin layer of copper is deposited. In the present embodiment the base portion of the layer 20 of TaN between about 150 and 450 Angstroms thick. The TaN layer 20 serves to prevent the migration of the subsequently deposited copper into the silicon region 12. An additional adhesion layer of Ti or Ta may also be incorporated beneath the layer of barrier material. Methods of forming such barrier layers are well known in the art and they are widely used in semiconductor technology. A copper seed layer between about 500 and 2,500 Angstroms thick is then deposited on the TaN barrier layer to assist in the initiation of the subsequent copper deposition. Both barrier and seed layers are sequentially deposited by IMP sputtering to form the barrier/seed layer 20.

Figure 1B:
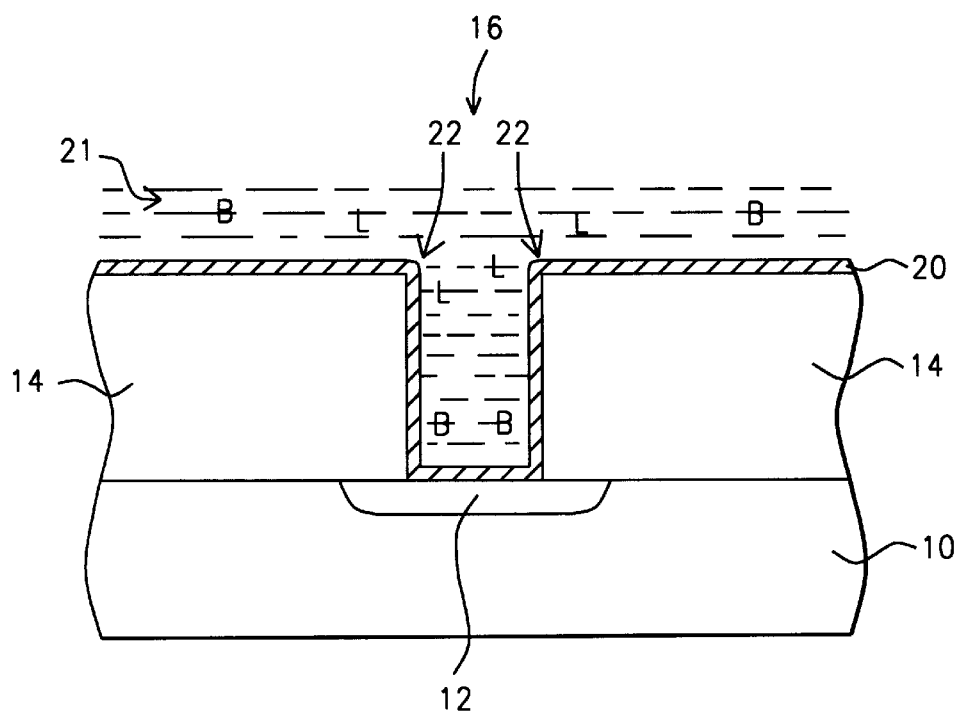

Referring to FIG. 1B, the wafer 10 is placed into an electrolyte bath 21 containing copper salts with additives including levelers, brighteners, and a surfactant. Copper plating salts which include these additives are available from commercial sources, for example, Vantage Circuit Products Ltd., Lancashire, UK. The bath temperature is maintained at between about 21 and 27° C.

first ECD period is initiated at a current density of between about 1.6 and 7.0 $mA./cm^2$. The electrolyte bath 21 is mechanically stirred in order to maintain concentration uniformity. The leveler molecules L are attracted to and adsorb at the outside corners 22 of the opening which are high field regions. The adsorbed leveler molecules L inhibit deposition in these region, thereby rounding and smoothing out the corners 22. Brightener molecules B are initially uniformly distributed in the electrolyte and at the deposition front on the barrier/seed layer 20.

Figure 1C:
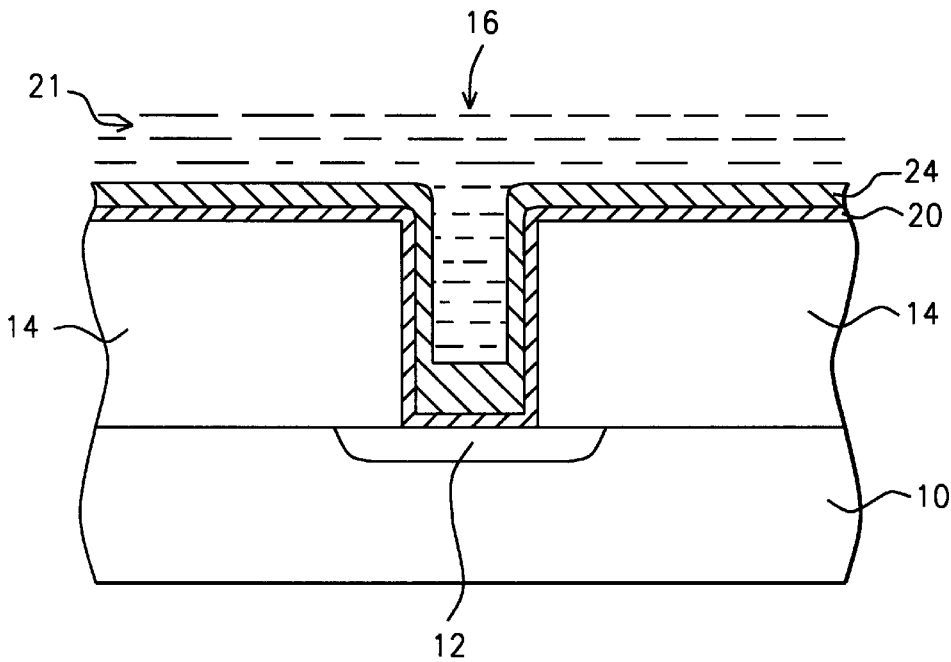

Referring now to FIG. 1C a layer of copper 24 is deposited after a period of time. Brightener molecules B participate in the charge transfer process at the deposition front and enhance the quality of the deposited copper. However, they are consumed by the process and must be replenished from the bulk of the electrolyte. Normally such replenishment is brought about by mechanical stirring of the electrolyte bath 21. However, the ability of mechanical stirring to replenish the components of the electrolyte becomes diminished within the opening 16 and the diminution increases toward the base 26 of the opening.

As the aspect ratio of the opening increases the ability of mechanical stirring to replenish electrolyte components within the opening 16 becomes increasingly further impaired until brightener replenishment becomes limited by diffusion. The imbalance of concentration of brightener in the electrolyte along the deposition front within the opening 16 caused by depletion reduces the throwing power of the electrolyte. Throwing power is a measure of the ability of a plating bath to deposit at a uniform thickness of metal from blanket field areas to hole areas. Thus it is a measure of the ability of a plating solution to produce a uniform metal distribution on an irregularly shaped cathode. The result of diminished throwing power within the opening 16 is that metal coverage within the opening is reduced.

Figure 1D:
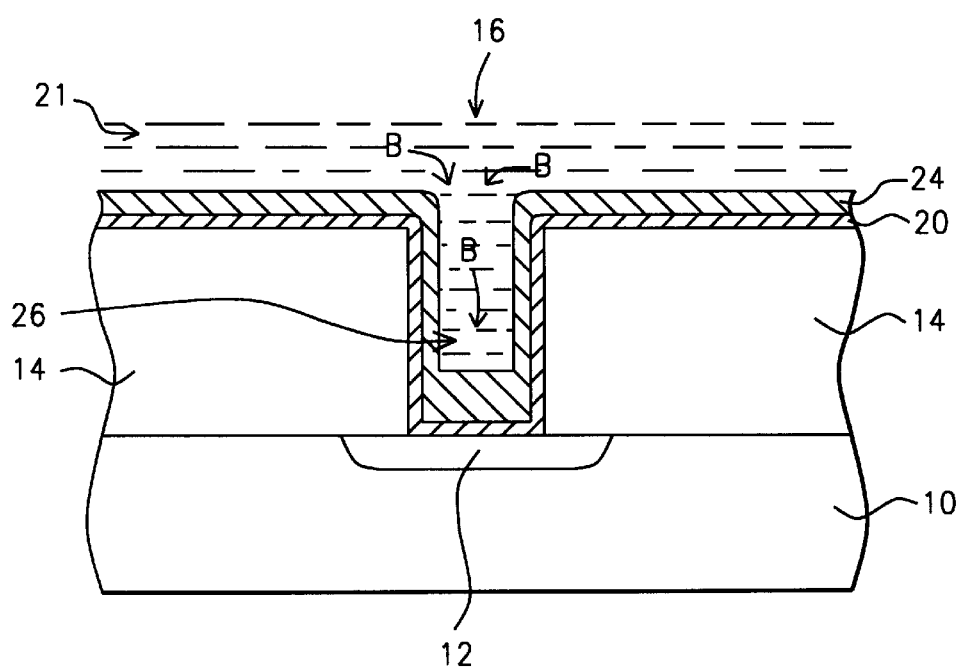

The thickness of the copper layer 24 which may be deposited before throwing power degradation becomes significant depends upon the applied current density and the aspect ratio of the opening 16. This must be determined experimentally. When this thickness is reached the low current density ECD is halted and the wafer is allowed to dwell in the electrolyte for a short period of time to allow brightener molecules B to diffuse from the bulk region of the electrolyte into the base region 26 of the opening 16 as illustrated in FIG. 1D. The dwell period is preferably between about 1 and 10 seconds. The low current density deposition of the thin copper layer 24 not only provides a highly conformal layer but also repairs any discontinuities or weak spots in the subjacent seed layer 21. The establishment of a uniform, continuous, and highly conformal copper lining is key to achieving a good quality final copper interconnect.

Figure 1E:
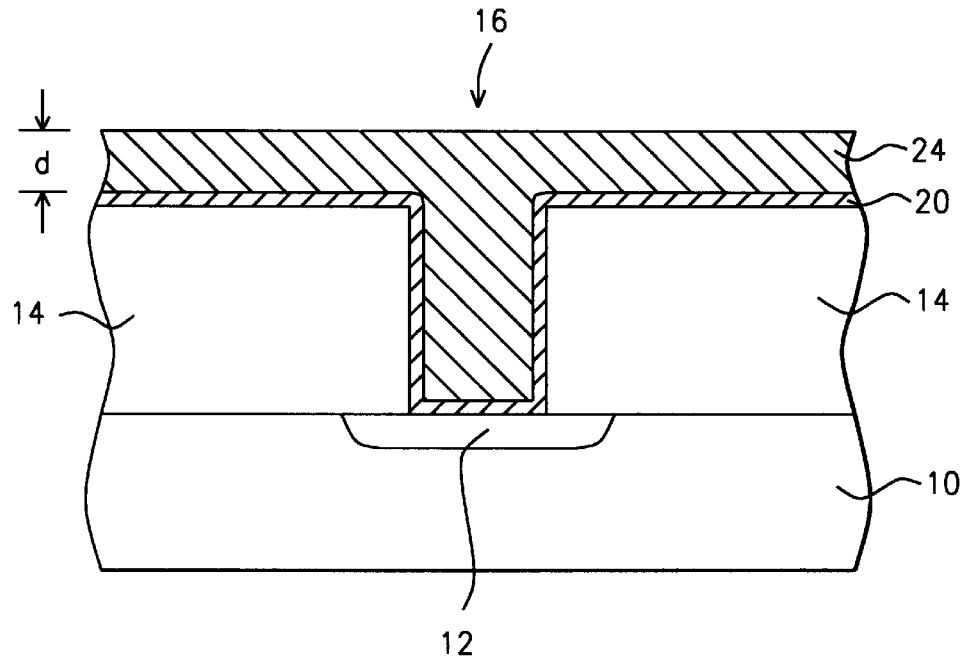

Having re-established a proper concentration of brightener molecules at the base 26 of the contact opening 16 during the dwell period and, having formed a high quality copper deposit with good conformality within the opening 16, current is re-applied at a significantly higher current density and copper is deposited at a significantly greater rate to complete the filling of the opening 16 and the ECD is continued for a second time period at the high current density until a target thickness "d" is reached on the planar surface of the wafer (FIG. 1E). In the present embodiment, wherein a copper plug is formed, the thickness d need only be sufficient to ensure the filling of the opening 16 to slightly above the level of the barrier/seed layer 20. The current density of the second ECD process step is preferably between about 9.5 and 25 mA./cm$^2$. These high current densities are possible because the structure of the copper deposit is well established during the first, low current density ECD period and deposition can proceed at a faster rate during the second ECD period without degrading the physical and electrical quality of the overall copper deposit.

Figure 1F:
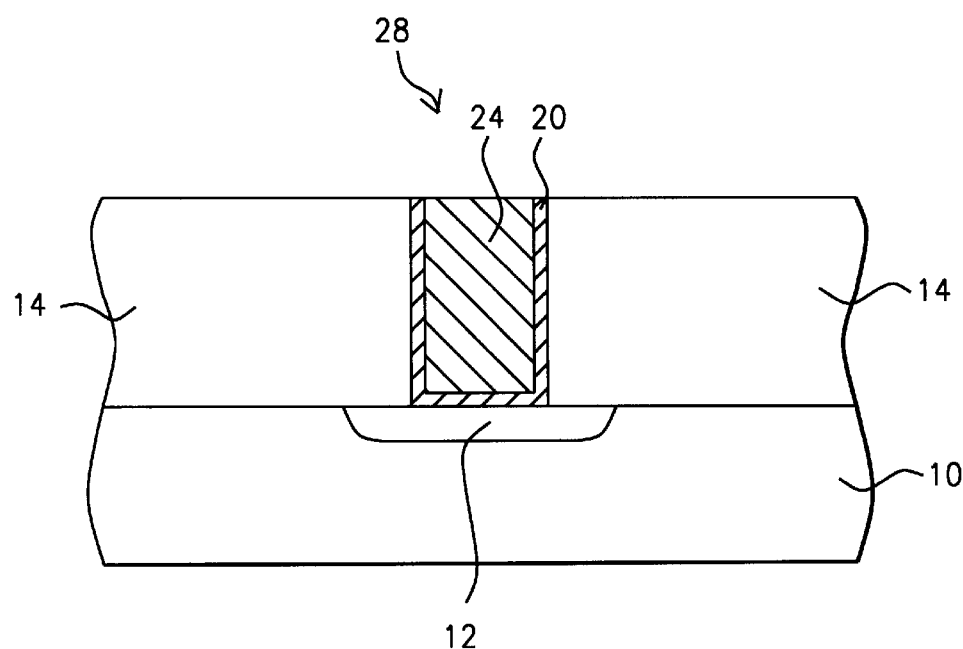

After the second ECD period is completed the wafer 10 is removed from the electrolyte, rinsed in de-ionized water and transferred to a CMP station. Referring to FIG. 1F, the wafer 10 is polished by CMP until the planar portion of the copper layer 24 and the barrier/seed layer 20 are removed the leaving an isolated copper plug contact 28.

In a second embodiment copper is deposited into a contact opening and over the surface of an integrated circuit wafer by the multiple step ECD process of the first embodiment. After filling the contact opening the ECD is continued at a high current density to form a layer of the copper over the planar surface which is then patterned and etched to form an interconnection wiring level of the integrated circuit. The wiring level is therefore integral and contiguous with the contact plug formed in the opening.

Figure 2:
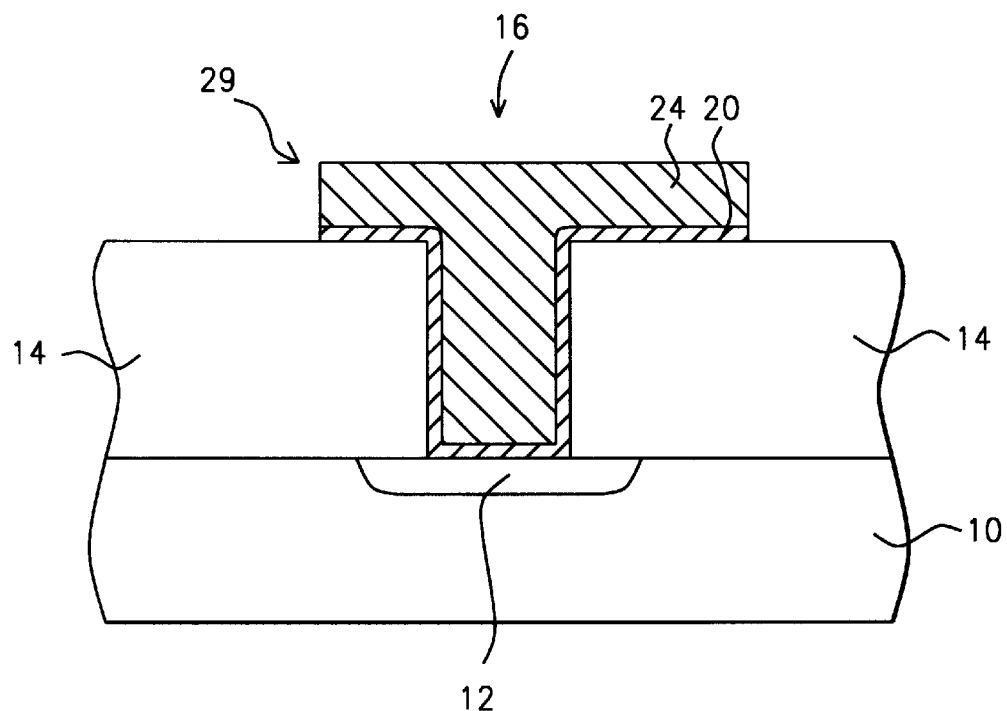
FIG. 2 is a cross sections of a silicon wafer illustrating final process steps for forming a contact and a layer of copper interconnection metallization according to a second embodiment of this invention.

The procedure of the first embodiment is followed verbatim to second high current density ECD step. Referring next to FIG. 2, the copper layer 24 is patterned, preferably by photoresist and etched by an anisotropic dry etching procedure, to form the wiring metallization 29 contiguous with the contact plug in the opening 16. Such dry etching procedures are well known in the art and utilize etchant gases containing halogens.

Figure 3A:
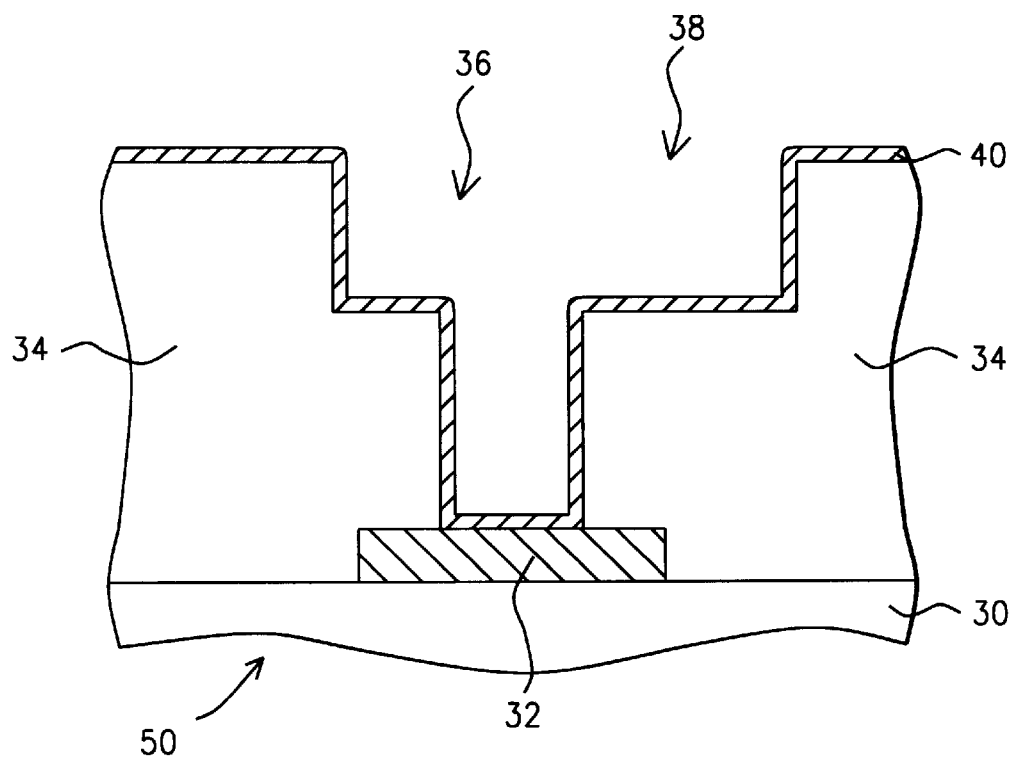
FIG. 3A through FIG. 3F are cross sections of a silicon wafer showing a sequence of process steps for forming a via and a layer of copper metallization by a dual damascene process according to a third embodiment of this invention.

In a third embodiment a copper metallization level is formed on an integrated circuit by a multi step ECD using a dual damascene structure. Referring first to FIG. 3A, there is shown a wafer 50 having an insulative layer 30 upon which a level of metallization 32 has been patterned. The metal pattern 32 is copper although it may alternately be formed of other metals such as aluminum or tungsten.

An insulative layer 34 is deposited on the wafer 28 over the metallization pattern 32 and a dual damascene patterned is etched into the layer 34. There are several ways in which the dual damascene structure in the insulative layer 34 can be formed. These methods are well known and the reader is referred to the descriptions in Chang, C. Y. and Sze, S. M., "ULSI Technology" McGraw-Hill, New York, (1996), p4444–445 and in El-Kareh, B., "Fundamentals of Semiconductor Processing Technologies", Kluwer, Boston (1995), p563–4.

In the cross sectional view shown in FIG. 3A, the deep opening 36 is a via opening, exposing a region of the metallization layer 32. The shallow opening 38 is the recessed image of an interconnection wiring pattern at the next level above the metallization pattern 32, which is to be formed by the ECD copper process of the invention. The via opening 36 and the recessed image 38 are patterned into the insulative layer 34 using an anisotropic dry etching technique, for example RIE (reactive ion etching) or plasma etching. Such patterning procedures are well known in the art.

A thin conductive barrier/seed layer 40 is deposited on the wafer, preferably by ionized PVD, for example, by IMP (ion metal plasma) sputtering. The barrier/seed layer 40 is a laminar structure comprising a base layer of a barrier material such as TiN, TaN, Ta or $WN_x$, over which a thin layer of copper is deposited. In the present embodiment the base layer portion of the layer 40 of TaN between about 150 and 450 Angstroms thick. The TaN layer 40 serves to block the migration of the subsequently deposited copper. An additional adhesion layer of Ti or Ta may also be incorporated beneath the layer of barrier material. Methods of forming such barrier layers are well known in the art and they are widely used in semiconductor technology. A copper seed layer between about 500 and 2,500 Angstroms thick is deposited on the TaN barrier layer to assist in the initiation of the copper deposition. Both barrier and seed layers are sequentially deposited by IMP sputtering to form the barrier/seed layer 40.

Figure 3B:
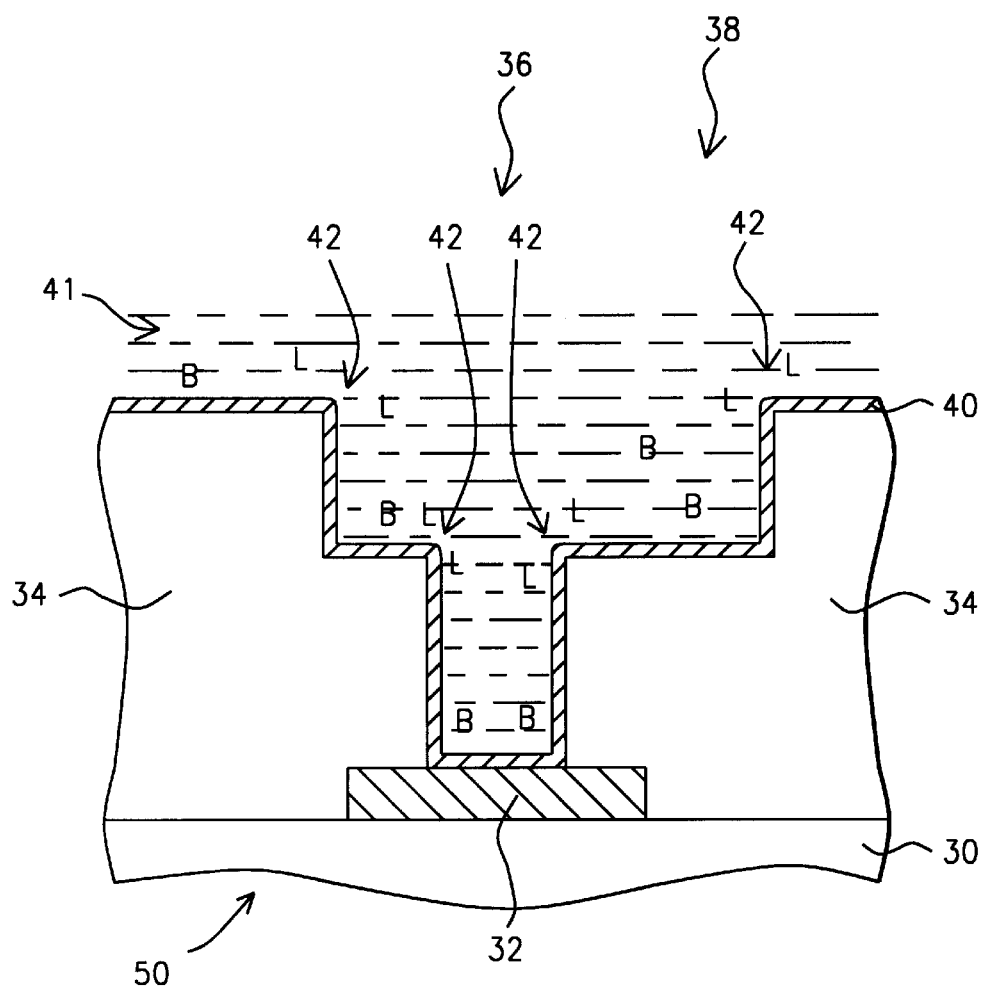

Referring to FIG. 3B, the wafer 50 is placed into an electrolyte bath 41 containing copper salts with additives including levelers, brighteners, and a surfactant. Copper plating salts which include these additives are available from commercial sources. The bath temperature is maintained at between about 21 and 27° C.

A first ECD period is then initiated at a current density of between about 1.6 and 7.0 mA./cm$^2$. The electrolyte bath 41 is mechanically stirred in order to maintain concentration uniformity. The leveler molecules L are attracted to and adsorb at the outside corners 42 of the opening which are high field regions. The adsorbed leveler molecules L inhibit deposition in these region, thereby rounding and smoothing out the corners 42. Brightener molecules B are initially uniformly distributed in the electrolyte and at the deposition front on the barrier/seed layer 40.

Figure 3C:
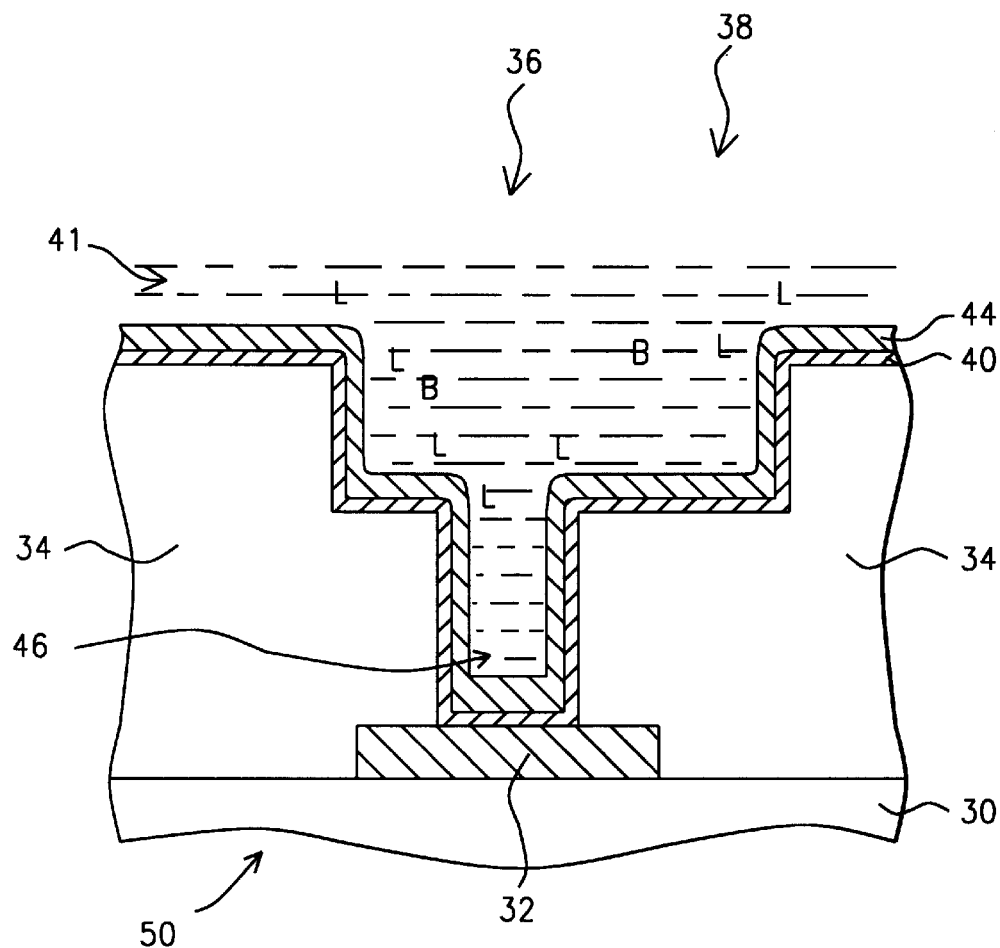

Referring now to FIG. 3C a layer of copper 44 is deposited after a period of time. Brightener molecules B participate in the charge transfer process at the deposition front and enhance the quality of the deposited copper. However, they are consumed by the process and must be replenished from the bulk of the electrolyte. Normally such replenishment is brought about by mechanical stirring of the electrolyte bath 41. An alternative mechanical stirring uses ultrasound. However, the ability of mechanical stirring to replenish the components of the electrolyte becomes diminished within the opening 46 and the diminution increases toward the base 46 of the opening.

As the aspect ratio of the opening increases the ability of mechanical stirring to replenish electrolyte components within the opening 46 becomes increasingly further impaired until brightener replenishment becomes limited by diffusion. The imbalance of concentration of brightener in the electrolyte along the deposition front within the opening 46 caused by depletion reduces the throwing power of the electrolyte. The result of diminished throwing power within the opening 36 is that metal coverage within the opening is reduced.

Figure 3D:
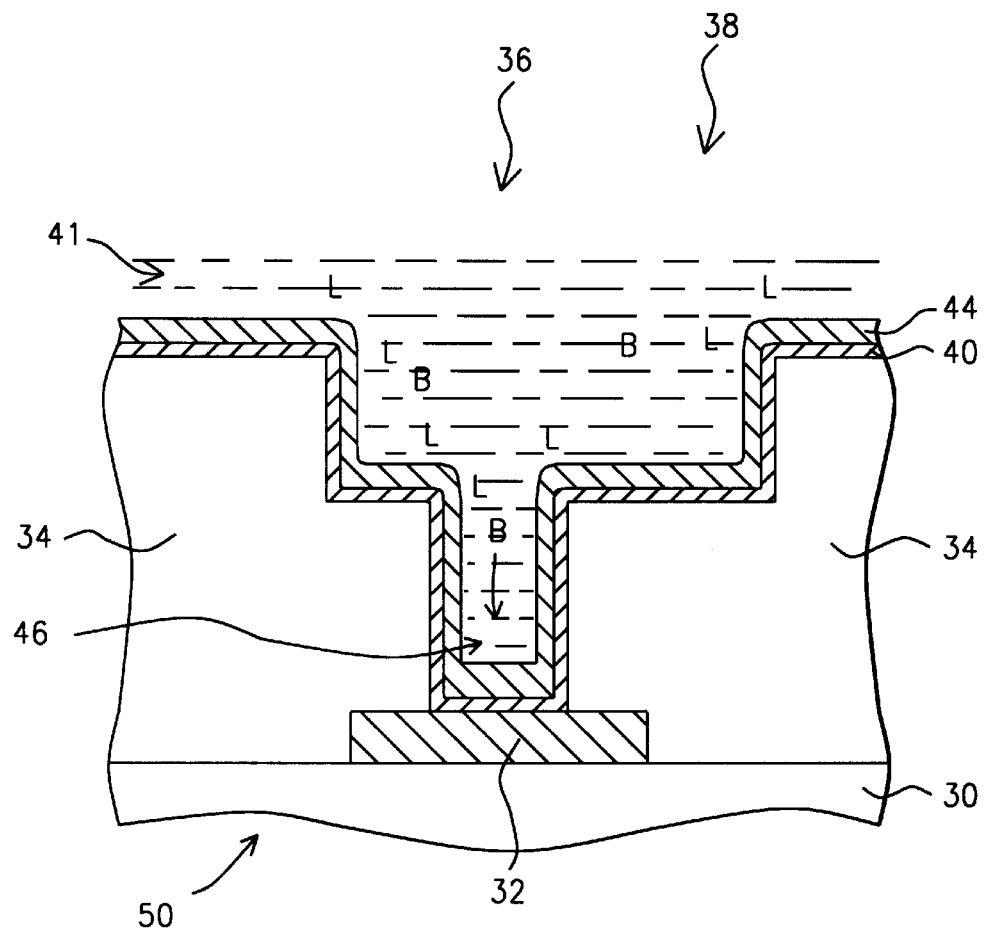

The thickness of the copper layer 44 which may be deposited before throwing power degradation becomes significant depends upon the applied current density and the aspect ratio of the opening 36. This must be determined experimentally. When this thickness is reached the low current density ECD is halted and the wafer is allowed to dwell in the electrolyte for a short period of time to allow brightener molecules B to diffuse from the bulk region of the electrolyte into the base region 46 of the opening 36 as illustrated in FIG. 3D. The dwell period is preferably between about 1 and 10 seconds.

Figure 3E:
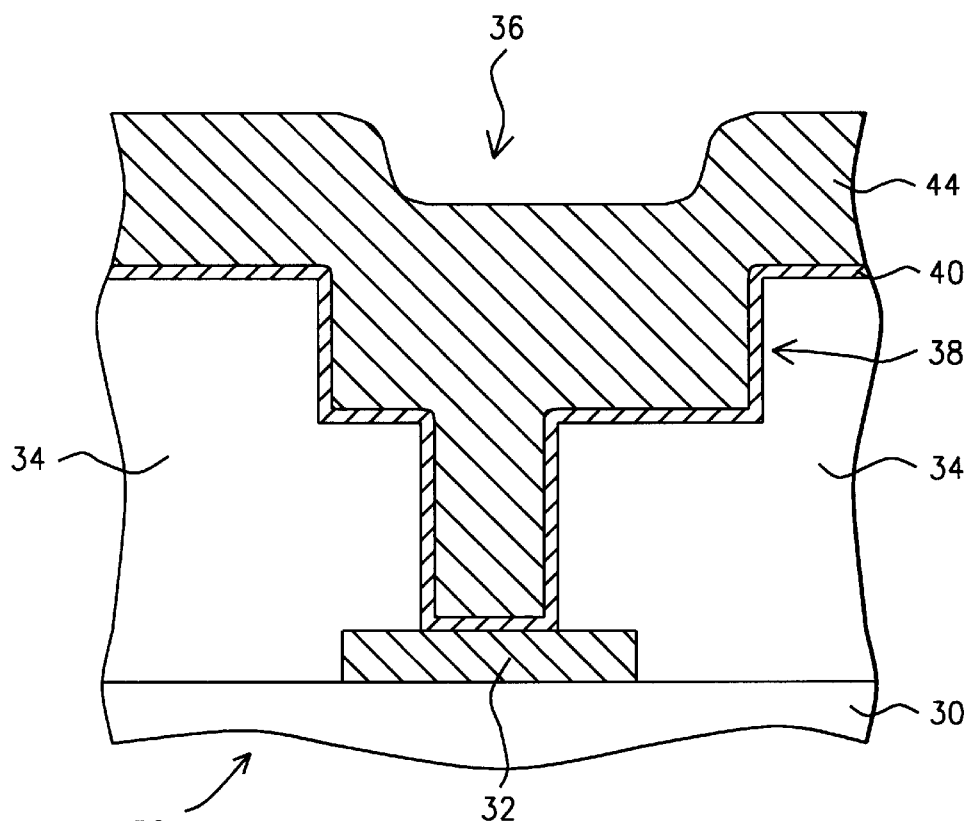

Having re-established a proper concentration of brightener molecules at the base 46 of the contact opening 36 during the dwell period and, having formed a high quality copper deposit with good conformality within the opening 36, current is re-applied at a significantly higher current density and copper is deposited at a significantly greater rate to complete the filling of the via opening 36 and the shallow opening 38. The ECD is continued for a second time period at the high current density until the level of the copper deposit 44 is above the plane of the barrier/seed layer 40 at it's highest point (FIG. 3E). The current density of the second ECD process step is preferably between about 9.5 and 25 mA./cm$^2$. These high current densities are possible because the structure of the copper deposit is well established during the first, low current density ECD period and deposition can proceed at a faster rate during the second ECD period without degrading the physical and electrical quality of the overall copper deposit.

Figure 3F:
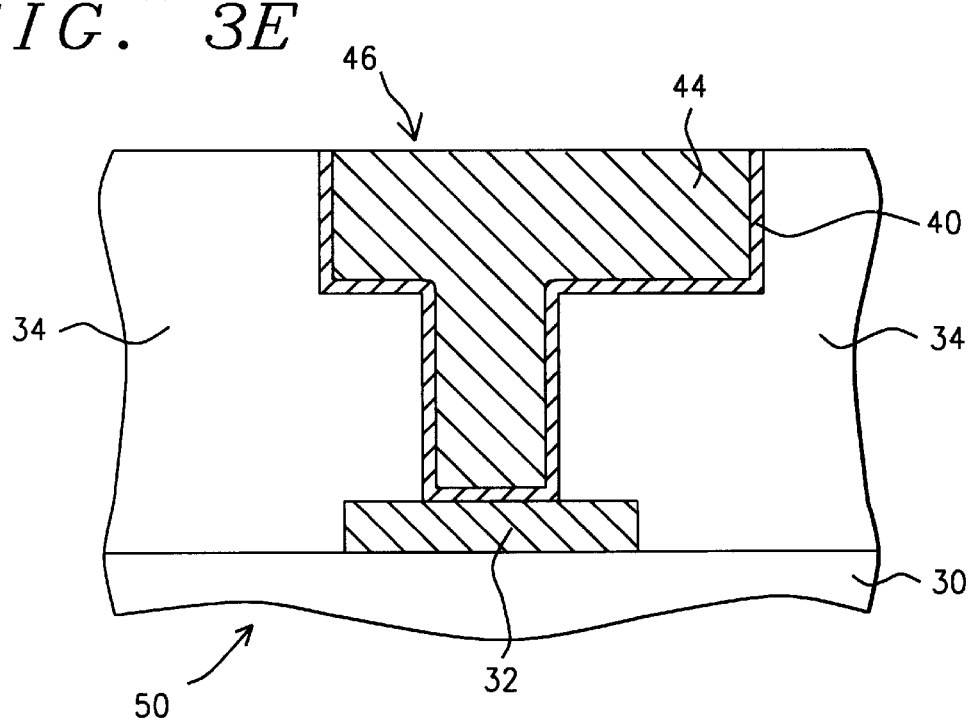

After the second ECD period is completed the wafer 50 is removed from the electrolyte, rinsed in de-ionized water and transferred to a CMP station. Referring to FIG. 3F, the wafer 50 is polished by CMP until the portion of the copper layer 44 and the barrier/seed layer 40 which are external to the metallization pattern are removed. The wiring metallization level 46 formed in the opening 38 is integral and contiguous with the via conductor formed in the opening 36.

While the invention has been particularly shown and described with reference to the preferred embodiments thereof, it will be understood by those skilled in the art that various changes in form and details may be made without departing from the spirit and scope of the invention.

While the first and second embodiments show the formation of a contact to a semiconductor substrate and the third embodiment shows the formation of a wiring level with a via, it should be understood that each embodiment can be applied equally well to the formation of both contacts and vias. It is also contemplated that, in the instance of very high aspect ratio contacts or vias, the low power density period may be interrupted by one or more dwell periods to assure proper brightener replenishment.

What is claimed is:

1. A method for forming a copper plug contact to a semiconductor wafer comprising:
   (a) providing a semiconductor wafer;
   (b) depositing an insulative layer on said semiconductor wafer;
   (c) forming an opening in said insulative layer, thereby exposing a region of said semiconductor wafer;
   (d) forming a barrier layer on said insulative layer and within said opening;
   (e) depositing a copper seed layer on said barrier layer;
   (f) placing said wafer in an electrolyte containing copper salts and a brightener additive;
   (g) providing agitation of said electrolyte;
   (h) depositing a first layer of copper on said wafer by applying current at a first current density for a first time period;
   (i) discontinuing said current for a second time period while maintaining said agitation;
   (j) depositing a second layer of copper on said wafer by applying current at a second current density for a third time period, said third time period being sufficient to fill said opening with deposited copper; and
   (k) polishing the surface of said wafer to expose said insulative layer adjacent to said opening thereby forming a copper plug contact.

2. The method of claim 1 wherein said barrier layer is selected from the group consisting of TaN, TiN, Ta, a layer of TaN over Ta, a layer of TiN over Ti, and WN$_x$.

3. The method of claim 1 wherein said electrolyte contains a leveler additive.

4. The method of claim 1 wherein said electrolyte is maintained at a temperature of between about 21 and 27° C.

5. The method of claim 1 wherein said first current density is between about 1.6 and 7.0 mA./cm$^2$.

6. The method of claim 1 wherein said second current density is between about 9.5 and 25 mA/cm$^2$.

7. The method of claim 1 wherein said second time period is between about 1 and 10 seconds.

8. The method of claim 1 wherein said agitation is accomplished by mechanical stirring.

9. The method of claim 1 wherein said agitation is accomplished by mechanical stirring and ultrasound.

10. The method of claim 1 wherein said barrier layer and said copper seed layer are sequentially deposited by IMP sputtering.

11. The method of claim 1 wherein said barrier layer is between about 150 and 450 Angstroms thick.

12. The method of claim 1 wherein said copper seed layer is between about 500 and 2,500 Angstroms thick.

13. A method for forming a dual damascene copper interconnect metallurgy on an integrated circuit wafer comprising:
   (a) providing an integrated circuit wafer;
   (b) depositing an insulative layer on said semiconductor wafer;
   (c) patterning a via openings and grooves which define an interconnection metallurgy in said insulative layer;
   (d) depositing a barrier layer on said insulative layer;
   (e) depositing a copper seed layer on said barrier layer;
   (f) placing said wafer in an electrolyte containing copper salts and a brightener additive;
   (g) applying agitation to said electrolyte;
   (h) depositing a first layer of copper on said wafer by applying current at a first current density for a first time period;
   (i) discontinuing said current for a second time period while maintaining said agitation;
   (j) depositing a second layer of copper on said wafer by applying current at a second current density for a third time period, said third time period being sufficient to fill said via openings and said grooves with copper to a level which lies above the plane of said barrier layer adjacent to said grooves and said via openings; and
   (k) polishing away portions of said copper and said barrier layer which lie on the surface of said wafer adjacent to said grooves and said via openings thereby forming a copper interconnection metallurgy.

14. The method of claim 13 wherein said barrier layer is selected from the group consisting of TaN, TiN, Ta, a layer of TaN on Ta, a layer of TiN on Ti, and WN$_x$.

15. The method of claim 13 wherein said electrolyte contains a leveler additive.

16. The method of claim 13 wherein said electrolyte is maintained at a temperature of between about 21 and 27° C.

17. The method of claim 13 wherein said first current density is between about 1.6 and 7.0 mA./cm$^2$.

18. The method of claim 13 wherein said second current density is between about 9.5 and 25 mA./cm$^2$.

19. The method of claim 13 wherein said second time period is between about 1 and 10 seconds.

20. The method of claim 13 wherein said agitation is accomplished by mechanical stirring.

21. The method of claim 13 wherein said agitation is accomplished by mechanical stirring and ultrasound.

22. The method of claim 13 wherein said barrier layer and said copper sewed layer are sequentially deposited by IMP sputtering.

23. The method of claim 13 wherein said barrier layer is between about 150 and 450 Angstroms thick.

24. The method of claim 13 wherein said copper seed layer is between about 500 and 2,500 Angstroms thick.

* * * * *